(12) United States Patent
Li et al.

(10) Patent No.: US 8,372,731 B2
(45) Date of Patent: Feb. 12, 2013

(54) DEVICE FABRICATION BY INK-JET PRINTING MATERIALS INTO BANK STRUCTURES, AND EMBOSSING TOOL

(75) Inventors: Shunpu Li, Cambridgeshire (GB); Christopher Newsome, Cambridgeshire (GB); David Russell, Cambridgeshire (GB); Thomas Kugler, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 612 days.

(21) Appl. No.: 11/714,098

(22) Filed: Mar. 6, 2007

(65) Prior Publication Data

US 2007/0287270 A1    Dec. 13, 2007

(30) Foreign Application Priority Data

Mar. 10, 2006 (GB) .................... 0604925.8

(51) Int. Cl.
*H01L 21/20* (2006.01)
(52) U.S. Cl. .............. 438/478; 438/149; 216/2
(58) Field of Classification Search .......... 438/478, 438/149
See application file for complete search history.

(56) References Cited

U.S. PATENT DOCUMENTS

| | | | |
|---|---|---|---|
| 5,512,131 A * | 4/1996 | Kumar et al. ............... 438/738 |
| 5,817,242 A * | 10/1998 | Biebuyck et al. ............ 216/41 |
| 6,949,199 B1 * | 9/2005 | Gauzner et al. ............. 216/2 |
| 7,252,570 B2 | 8/2007 | Takashima et al. |
| 7,482,207 B2 * | 1/2009 | Brown et al. ............... 438/149 |
| 2003/0232179 A1 | 12/2003 | Steenblik et al. |
| 2004/0002216 A1 | 1/2004 | Taussig et al. |
| 2004/0173871 A1 | 9/2004 | Morales et al. |
| 2004/0211754 A1 * | 10/2004 | Sreenivasan ............... 216/41 |
| 2006/0272942 A1 * | 12/2006 | Sirringhaus ............... 204/406 |
| 2007/0096080 A1 * | 5/2007 | Cain et al. ................. 257/40 |

FOREIGN PATENT DOCUMENTS

| | | |
|---|---|---|
| DE | 102 02 145 A1 | 5/2003 |
| JP | A 58-168048 | 10/1983 |
| JP | 2004-247279 | 9/2004 |
| JP | 2005-158584 | 6/2005 |
| JP | 2006-165234 | 6/2006 |
| WO | WO 02/068321 A2 | 9/2002 |
| WO | WO 03/073164 A2 | 9/2003 |
| WO | WO 2004/097518 A3 | 11/2004 |

OTHER PUBLICATIONS

Nov. 18, 2010 Office Action issued in British Patent Application No. GB0604925.8.

* cited by examiner

*Primary Examiner* — David Vu
*Assistant Examiner* — Caleb Henry
(74) *Attorney, Agent, or Firm* — Oliff & Berridge, PLC

(57) ABSTRACT

The invention disclosed relates to the fabrication of electronic devices. A method for fabricating an electronic device is disclosed, comprising embossing a surface of a work-piece 200, 202 using an embossing tool 204, so as to form a microstructure having at least two levels of thickness contrast on the work-piece surface, and depositing fluid 208 containing a functional material onto the microstructure. In a preferred embodiment, the step of depositing fluid 208 comprises ink-jet printing. An embossing tool 204 for creating a microstructure on a work-piece 200, 202 is also disclosed, the embossing tool 204 comprising a first surface and steps of at least two different heights relative to the first surface.

8 Claims, 7 Drawing Sheets

DEVICE FABRICATION BY INK-JET PRINTING MATERIALS INTO BANK STRUCTURES, AND EMBOSSING TOOL

BACKGROUND OF THE INVENTION

Electronics based on organic and inorganic solution processable materials have attracted enormous research interest in the past few decades. These materials have proven their potential for use in a wide range of applications, such as light-emitting diodes (LEDs), photovoltaic cells and thin film transistors (TFTs). Recent developments in patterning technology have further proven their potential for the manufacture of large area integrated devices on both rigid and flexible substrates. Various fabrication techniques, such as optical lithography, micro-embossing, soft-contact printing, screen printing, ink-jet printing and optical interference lithography can be employed to fabricate electronic devices. While these techniques allow for patterning at a reasonably high resolution, the necessary tool alignment with structures that have been previously defined on a substrate presents difficulties. Accurate alignment is especially difficult in the case of large area, flexible substrates, due to the occurrence of warping, thermal expansion or shrinking of the substrate. Furthermore, in the case of roll-to-roll fabrication techniques, non-uniform distortions due to the tension applied to the substrate during transfer can cause further alignment difficulties.

Ink-jet printing is a very promising technique for electronic device manufacture, but the currently available free-format printing resolution (around 50 µm) is insufficient to meet the requirements of the electronics industry. In order to obtain higher resolution structures using ink-jet printing, bank structures with philic/phobic contrast have been employed to confine the printed liquid, thus increasing the printing resolution. However, even using such bank structures it is difficult to fabricate electronic devices at a sufficiently high resolution without defects occurring.

Embossing tools have been used previously to fabricate bank structures, and such embossed bank structures have also been combined with ink-jet printing. However, it has been found that such embossed structures have disadvantages in many important applications.

FIG. 1 shows a conventional method for producing a high resolution ink-jet printed structure, using a bank structure defined by an embossing tool. Briefly, a polymer layer 102 is deposited on a substrate 100 (FIG. 1a). The system is then heated to a fixed temperature and a hard embossing tool 104 is pressed against the polymer. After cooling the system to room temperature, the embossing tool 104 is removed to leave an embossed structure in the polymer 102 (FIG. 1b). An $O_2$ plasma etching process is then performed to entirely remove the polymer remaining in the indentations of the embossed structure (FIG. 1c). After an appropriate surface treatment, e.g. plasma treatment or application of a self-assembled molecular monolayer (SAM) by soft-contact printing, to create a philic/phobic contrast (FIG. 1d), a functional material 108 is ink-jet printed onto the embossed structure (FIG. 1e). The expression "philic/phobic contrast" refers to the relative attraction or repulsion of the functional material 108 to or from treated portions 106 of the surface of the embossed structure and untreated portions of the surface. For example, if the functional material 108 is water-based, a philic/phobic contrast may be provided by treating the structure so that some portions are hydrophilic and other portions are hydrophobic.

It is difficult to ensure electrode isolation in light-emitting diode (LED) devices fabricated by printing materials onto a conventional embossed bank structure. In addition, in thin film transistor (TFT) fabrication, reliably forming a short channel by printing material onto an embossed bank structure is a problem due to bank contamination, i.e. bridging between adjacent electrodes across a bank.

An object of the present invention is to provide an ink-jet printing and embossing technique capable of fabricating capacitor structures having good insulation properties and also capable of forming short channels for TFT manufacture.

SUMMARY OF THE INVENTION

The present invention is based on the finding that the above problems with fabrication methods using embossing are at least in part due to the fact that the embossed bank structures used in existing fabrication techniques have a single thickness contrast. The applicant has found that the above problems can be alleviated by using a multi-stepped embossing tool to form an embossed bank structure having at least two levels of thickness contrast.

According to one aspect of the present invention, there is provided a method for fabricating an electronic device, the method comprising: embossing a surface of a work-piece using an embossing tool, so as to form a microstructure having at least two levels of thickness contrast on the work-piece surface; and depositing fluid containing a functional material onto the microstructure.

The present invention provides a fast and cheap patterning method based on depositing materials into an embossed bank structure. The technique of the present invention also reduces the occurrence of defects when printing high resolution structures. Embossing the work-piece surface to form a microstructure having at least two levels of thickness contrast enables different receiving portions of the microstructure on which different layers of functional material are deposited to have different depths. As a result, the receiving portions can be given different characteristics at particular stages of the fabrication process, to ensure that only the correct functional material is deposited on each receiving portion and to prevent the defects associated with conventional embossing techniques being formed. For example, a philic/phobic contrast can be established between different receiving portions when a given functional material is being deposited so that the functional material is attracted to the desired receiving portion and repelled from other receiving portions.

Preferably, the step of depositing fluid comprises ink-jet printing.

In one embodiment, the microstructure includes a stepped indentation formed in the work-piece surface, the indentation having a bottom surface and a step surface, wherein the step surface is less indented into the work-piece surface than the bottom surface, the step of depositing fluid comprising: depositing a first layer of material on the bottom surface; depositing a second layer of material in the indentation; and depositing a third layer of material on the second layer of material.

Suitably, the work-piece comprises a substrate and an embossing layer formed on the substrate, wherein the microstructure includes a stepped indentation formed in the embossing layer, the indentation having a bottom surface and a step surface, wherein the step surface is less indented into the work-piece surface than the bottom surface, and wherein the step of depositing fluid comprises: etching the work-piece surface after the step of embossing to remove the embossing layer at the bottom surface, thereby exposing a portion of the substrate surface; and performing a first treatment on the work-piece surface to create a wetting contrast between the exposed portion of the substrate surface and the other portions of the work-piece surface.

Preferably, the method further comprises: depositing a first layer of material on the bottom surface after performing the first treatment; performing a second treatment on the work-piece surface to remove wetting contrast between a surface of the first layer of material and other portions of the work-piece surface; performing a third treatment on the work-piece surface to create a wetting contrast between the portion of the work-piece surface in the indentation and other portions of the work-piece surface; depositing a second layer of material in the indentation; and depositing a third layer of material on the second layer of material.

Suitably, the first and second treatments comprise plasma treatment. Conveniently, the third treatment comprises soft-contact printing. Preferably, the first and third layers of material are electrodes.

In another embodiment, the work-piece comprises a substrate and an embossing layer formed on the substrate, and the microstructure includes first and second indentations in the embossing layer, the first indentation being deeper than the second indentation, the step of depositing fluid comprising: depositing a first layer of material into the first indentation; and depositing a second layer of material into the second indentation.

Preferably, the method further comprises: etching the work-piece to remove the embossing layer at the bottom of the first indentation, exposing a portion of the substrate surface, before the step of depositing a first layer of material; and etching the work-piece to remove a portion of the embossing layer at the bottom of the second indentation, exposing another portion of the substrate surface, before the step of depositing a second layer of material.

Suitably, the method further comprises: performing a first treatment on the work-piece surface to create a wetting contrast between the first indentation and other portions of the work-piece surface, before the step of depositing a first layer of material; and performing a second treatment on the work-piece surface to create a wetting contrast between the second indentation and other portions of the work-piece surface, before the step of depositing a second layer of material.

Suitably, the work-piece comprises a substrate and an embossing layer formed on the substrate, wherein the microstructure includes first and second indentations in the embossing layer, the first indentation being deeper than the second indentation, the step of depositing fluid comprising: etching the work-piece to remove the embossing layer at the bottom of the first indentation, exposing a portion of the substrate surface; performing a first treatment on the work-piece surface to create a wetting contrast between the exposed portion of the substrate surface and other portions of the work-piece surface.

Preferably, the method further comprises: depositing a first layer of material into the first indentation after performing the first treatment; etching the work-piece to remove the embossing layer at the bottom of the second indentation, exposing a further portion of the substrate surface; performing a second treatment on the work-piece surface to create a wetting contrast between the further exposed portion of the substrate surface and other portions of the work-piece surface; and depositing a second layer of material into the second indentation.

Suitably, the first and second layers of material are deposited by ink-jet printing. Preferably, the first and second layers of material are electrodes. Conveniently, the first and second treatments are plasma treatments.

Preferably, the method further comprises: removing the remaining portions of the embossing layer from the substrate; depositing a semiconductor layer over the substrate; depositing an insulator layer over the semiconductor layer; and depositing a gate electrode over the insulator layer.

In one embodiment, the method is for fabricating an organic or inorganic thin film transistor. In another embodiment, the method is for fabricating a capacitor structure. Suitably, the method is for fabricating a capacitor. In yet another embodiment, the method is for fabricating a light emitting diode. Suitably, the method is for fabricating a ferroelectric memory device.

Preferably, the embossing tool comprises a first surface and steps of two different heights relative to the first surface. Suitably, the embossing tool comprises a first surface and steps of more than two different heights relative to the first surface. Preferably, the embossing tool is made from a semiconductor, metal or ceramic material. Suitably, features of the microstructure formed by embossing have dimensions of between 10 nm and 1 mm. Preferably, a thickness difference between the levels of thickness contrast is between 10 nm and 10 μm. Conveniently, the fluid is a solution or a colloidal suspension.

Suitably, there is provided a method for fabricating an electronic device on a substrate in a roll-to-roll or sheet-to-sheet process, comprising a method as described above. Conveniently, there is provided a method for fabricating an electronic circuit, comprising a method as described above.

In another aspect of the present invention, there is provided an electronic device fabricated by a method as described above. Conveniently, there is provided a flexible display panel fabricated by a method as described above. Suitably, there is provided a ferroelectric memory device fabricated by a method as described above.

According to another aspect of the present invention, there is provided an embossing tool for creating a microstructure on a substrate, the embossing tool comprising: a first surface; and steps of at least two different heights relative to the first surface. Such an embossing tool can be used in the method of the present invention to provide a fast and cheap patterning method that avoids defects, as discussed above.

In one embodiment, the embossing tool comprises: a first step formed on the first surface; and a second step formed on the first step. In another embodiment, the embossing tool comprises: a first step having a first height, formed on a first portion of the first surface; and a second step having a second height different from the first height, formed on a second portion of the first surface.

BRIEF DESCRIPTION OF THE DRAWINGS

Embodiments of the present invention will now be described by way of further example only and with reference to the accompanying drawings, in which.

DETAILED DESCRIPTION

Figure 1A:
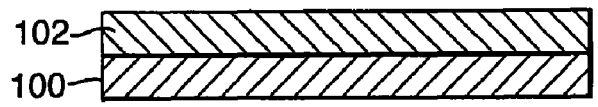
FIG. 1 shows a conventional method for producing a high resolution ink-jet printed structure.
Figure 1B:
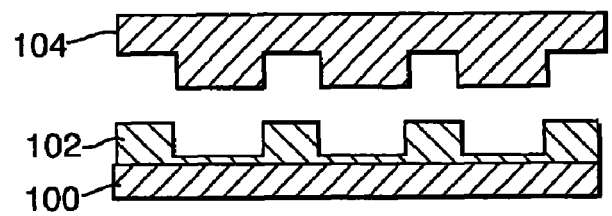
Figure 1C:
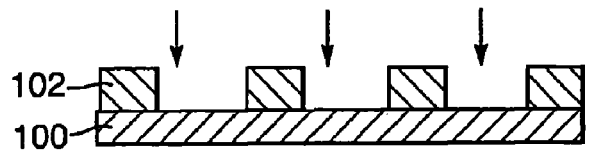
Figure 1D:
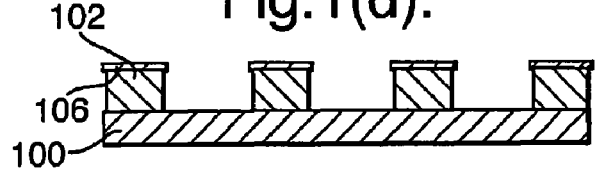
Figure 1E:
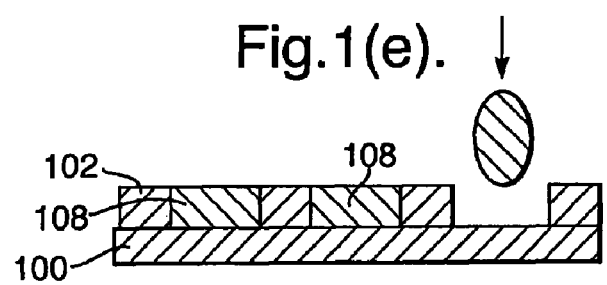
Figure 2A:
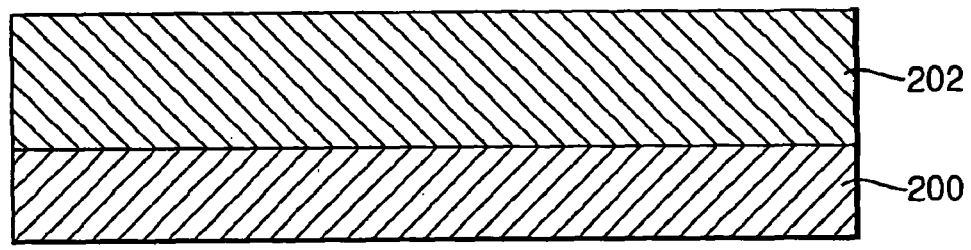
FIG. 2 shows an embossing and etching process using a multi-stepped embossing tool according to an embodiment of the present invention.
Figure 2B:
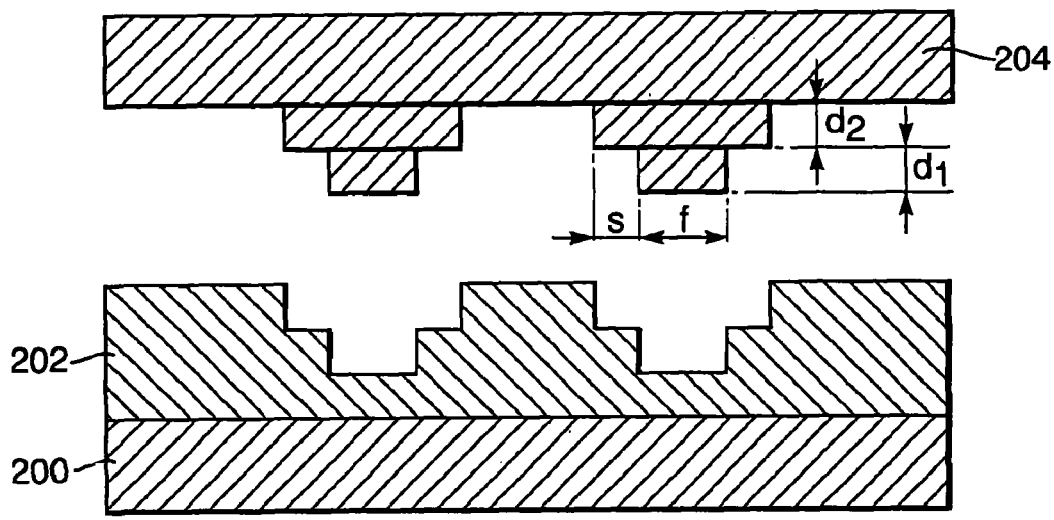
Figure 2C:
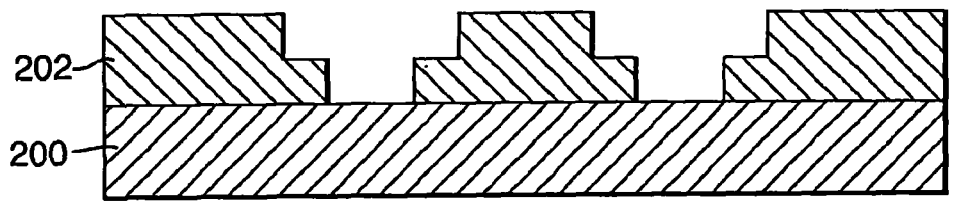
Figure 3A:
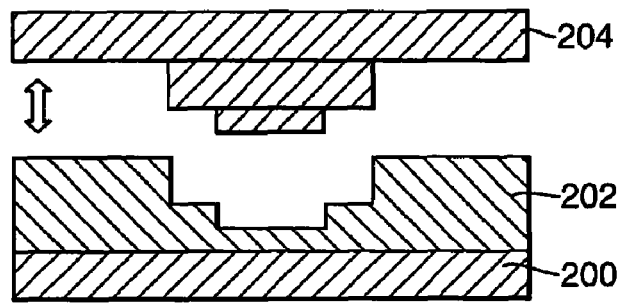
FIG. 3 shows a capacitor structure fabrication process according to an embodiment of the present invention.
Figure 3B:
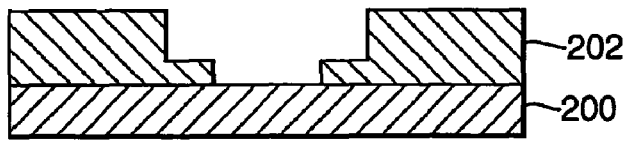
Figure 3C:
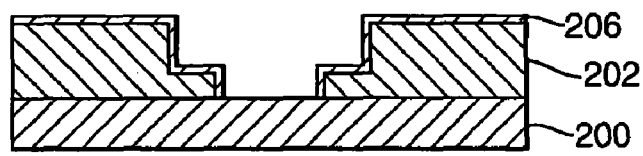
Figure 3D:
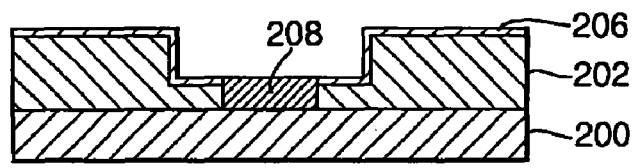
Figure 3E:
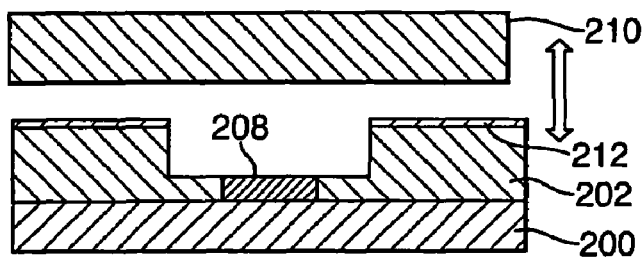
Figure 3F:
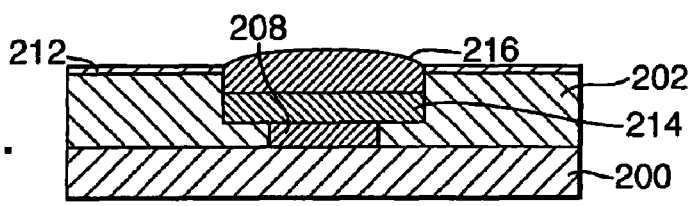

A multi-stepped tool 204 according to an embodiment of the present invention and its application are shown in FIG. 2. FIG. 2 illustrates a similar process to that shown in FIGS. 1a to 1c, comprising embossing and subsequently etching a polymer layer 202 formed on a substrate 200, but the process shown in FIG. 2 uses a two-stepped embossing tool 204. The use of a multi-stepped embossing tool provides significant advantages, as described below.

FIG. 3 shows a capacitor structure fabrication process according to an embodiment of the present invention. A 1 µm thick layer of poly(methyl methacrylate) (PMMA) 202 is spun onto a glass substrate 200 and pre-baked at 140° C. for 5 min. Then a multi-stepped silicon embossing tool 204 fabricated by optical lithography is pressed against the PMMA layer 202 at 170° C. After cooling the system to room temperature, the embossing tool 204 is released, leaving a stepped indentation in the PMMA layer 202 (FIG. 3a). The dimensions of the embossing tool 204 vary depending on the particular application, but typical dimensions are (see FIG. 2b): length of front plate f=30 µm, first step depth d1=500 nm, second step depth d2=400 nm, and second step length s=5 µm. The PMMA structure defined by embossing is etched by $O_2$ plasma to expose the glass substrate 200 at the bottom of the indentation (FIG. 3b). The sample is then treated using $CF_4$ plasma for 30 seconds to make the surface 206 of the PMMA 202 hydrophobic, while the glass 200 remains highly hydrophilic (FIG. 3c). A water-based solution of poly(3,4-ethylene-dioxythiophene) doped with poly(styrene sulphonic acid) (PEDOT-PSS) is then printed onto the bottom of the indentation to form a first electrode 208 (FIG. 3d). After being dried at 100° C. for 5 min, the sample is treated by $O_2$ plasma for 1 min in order to make the whole surface of the sample hydrophilic. A hydrophobic SAM layer 212 of H1,H1,H2,H2, perfluorodecyltrichlorosilane (0.01 mol solution in hexane) is then defined by soft contact printing using an unstructured polydimethylsiloxane (PDMS) stamp 210 (FIG. 3e). A functional material 214 or several functional materials can then be printed into the indentation over the first electrode 208. Various materials can be printed depending on the application. For instance, a poly(4-vinylphenol) (PVP) isopropanol solution can be printed to produce a simple capacitor, and poly(p-phenylene vinylene) (PPV) can be printed to fabricate a light emitting diode (LED) device. After drying the sample at 60° C. for 5 min, a second PEDOT-PSS electrode 216 is printed over the functional material 214 to complete the structure.

An important feature of this process is that it introduces a step between the first printed electrode 208 and the functional material 214 deposited above the first electrode 208. This prevents current leakage between the first and second electrodes 208, 216, which might otherwise occur due to bridging across the functional material layer 214 and is a problem in conventional techniques.

Figure 5:
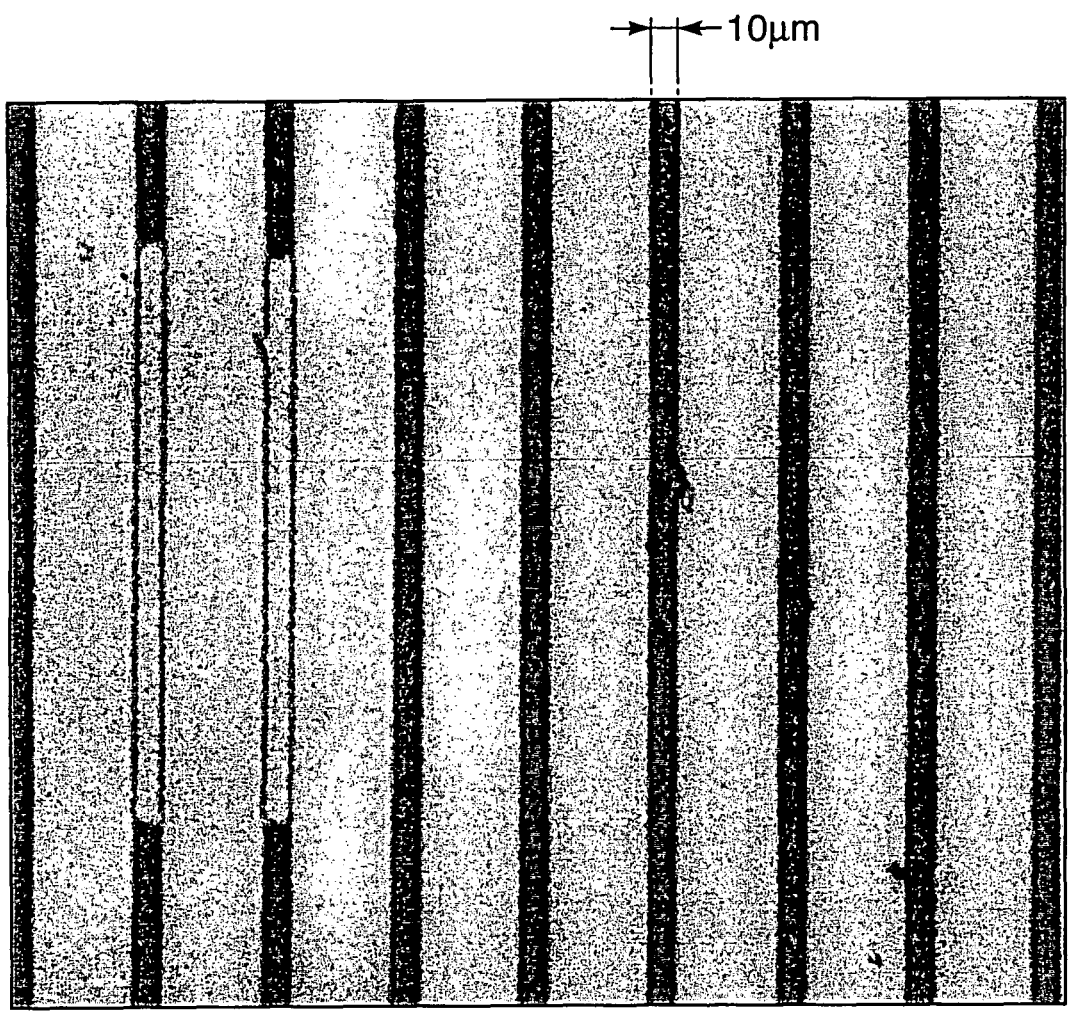
FIG. 5 shows a structure formed by a prior art ink-jet printing technique, the structure having a defect due to bank contamination.
Figure 6A:
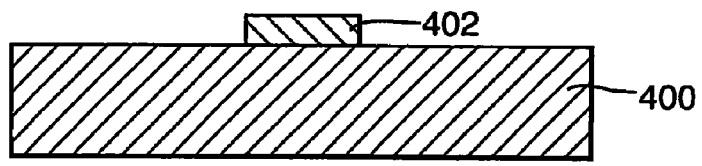
FIG. 6 illustrates a process for fabricating an embossing tool according to an embodiment of the present invention.
Figure 6B:
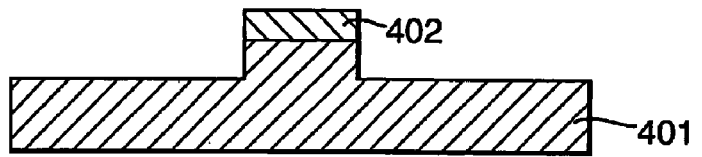
Figure 6C:
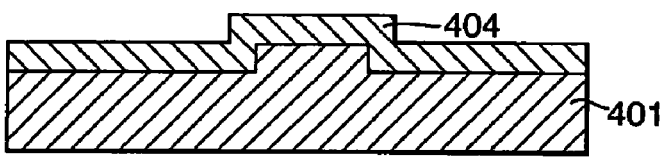
Figure 6D:
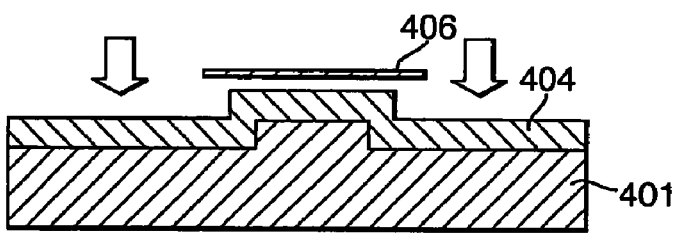
Figure 6E:
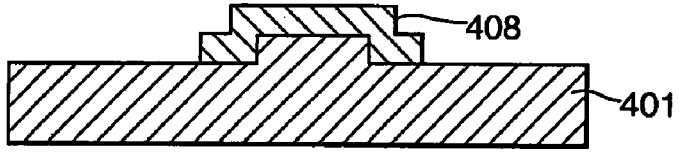
Figure 6F:
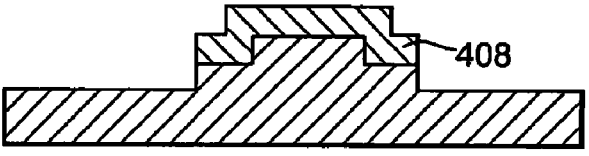
Figure 6G:
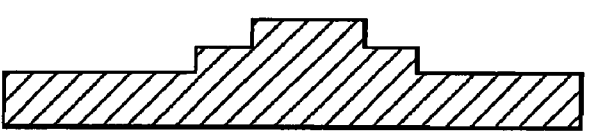

A further embodiment of the invention is a fabrication process for a short-channel thin film transistor (TFT). It has previously been attempted to define source-drain channels of TFTs by ink-jet printing conductive materials into bank structures. However, defining very short channels (from a few µm to sub-µm) has been found difficult, because the printed droplet is large enough to span the narrow bank between the source and drain electrodes, so that the resulting electrodes are often bridged. FIG. 5 shows such a defect in a structure formed by printing a silver colloid into a PMMA bank structure having a bank width of 10 µm.

A process according to the present invention, which provides a solution to the above problem, is shown in FIG. 4. Initially, a 1 µm thick PMMA film 302 is spin-coated onto a glass substrate 300 (FIG. 4a). An embossing tool 304 consisting of a silicon mold having a two-level thickness contrast is then used to emboss the PMMA layer 302 at 170° C. (FIG. 4b). Typical dimensions for the mold structure 304 (see FIG. 4b) are: f~30-40 µm, d1~600 nm, d2~900 nm, L~2-5 µm. The two steps have the same length f in this embodiment, but this is not necessarily the case. The dimension L is limited by the resolution of optical lithography in this example, and can be made sub-µm by using higher resolution techniques such as electron beam lithography and nano-imprinting.

Figure 4A:
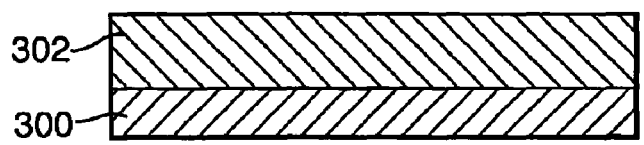
FIG. 4 shows a short channel TFT fabrication process according to an embodiment of the present invention.
Figure 4B:
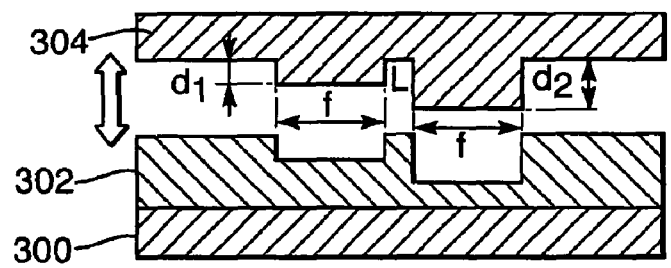
Figure 4C:
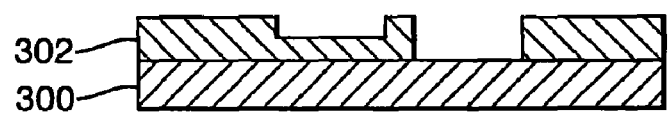
Figure 4D:
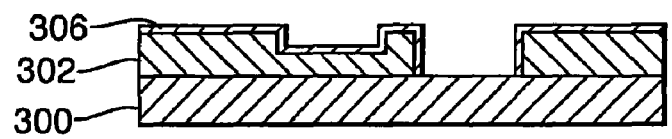
Figure 4E:
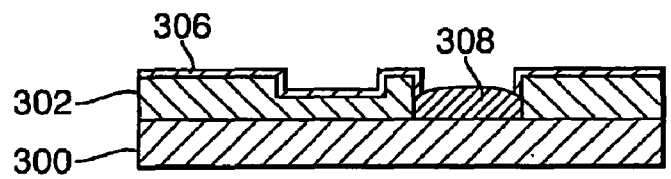
Figure 4F:
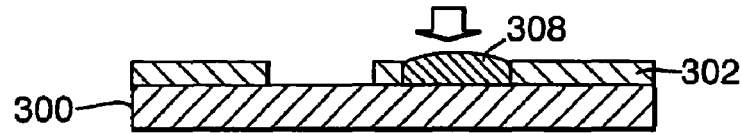
Figure 4G:
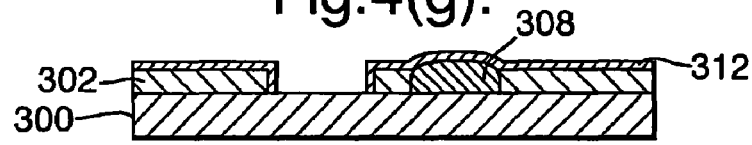
Figure 4H:
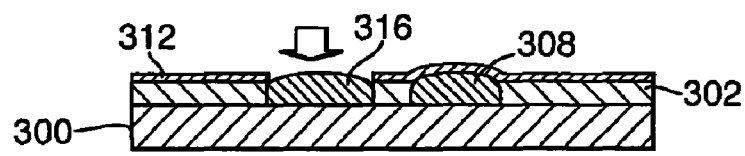
Figure 4I:

The PMMA structure defined by embossing is etched using an $O_2$ plasma so as to expose the glass substrate 300 under the deeper indentations in the structure (FIG. 4c). The sample is then treated with $CF_4$ plasma for 30 s to make the PMMA surface 306 hydrophobic, while the glass remains highly hydrophilic (FIG. 4d). A PEDOT-PSS solution is printed onto the glass substrate 300 at the bottom of the deeper indentations to form a first source/drain electrode 308 (FIG. 4e). After drying at 100° C. for 5 min, the sample is etched again with an $O_2$ plasma to expose the glass substrate 300 under the shallower indentations in the structure (FIG. 4f). Another $CF_4$ plasma treatment is applied in order to make both the PMMA surface 312 and the printed PEDOT-PSS surface hydrophobic (FIG. 4g). A PEDOT solution is then printed into the openings defined by the shallower indentations (FIG. 4h) to form a second source/drain electrode 316. Thus, the water based PEDOT solution is always printed in hydrophilic indentations having highly hydrophobic adjacent areas, preventing bank contamination.

Figure 4J:
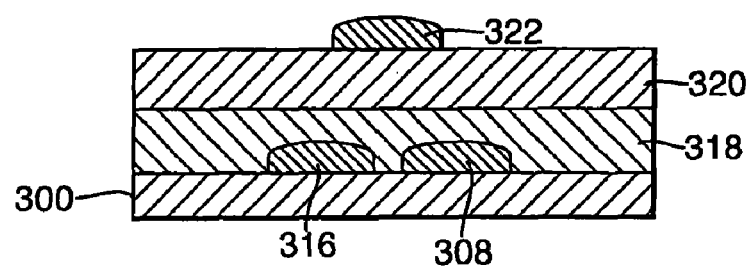

After removing the PMMA banks in acetone (FIG. 4i), a 40 nm thick poly 3-hexylthiophene (P3HT) semiconductor layer 318 and a 600 nm thick poly(4-vinylphenol) (PVP) dielectric layer 320 are spin-coated onto the sample in sequence. Finally, a PEDOT gate electrode 322 is printed on the dielectric layer 320 to complete the TFT fabrication process (FIG. 4j).

The above processes are particularly suitable for use in manufacturing ink-jet printed electronic circuits and flexible panel displays.

FIG. 6 shows an embossing tool fabrication process according to an embodiment of the invention. A photo-resist structure 402 is first defined on an Si substrate 400 using optical lithography (FIG. 6a). Then, a plasma consisting of a mixture of $SF_6$ (or $CF_4$) and $O_2$ is used to etch the substrate 400, the photo-resist 402 functioning as a mask (FIG. 6b). The remaining photo-resist 402 is removed with commercial resist remover, and another layer of photo-resist 404 is coated onto the structured Si substrate 401. After baking under conditions appropriate for the photo-resist material used, a second optical lithography step is carried out using another mask 406 having a desired structure, to form a second photo-resist structure 408 (FIGS. 6d and 6e). Plasma etching is then performed by using the second photo-resist structure 408 as a mask (FIG. 6f). Finally, the remaining photo-resist 408 is removed (FIG. 6g).

In the above embodiments, $O_2$, $CF_4$ and $SF_6$ plasmas are used to etch and treat the surface of the sample during the fabrication process. However, it will be appreciated that alternative surface treatment techniques can be used. These include other plasma etching techniques, corona discharge treatment, UV-ozone treatment, and wet-chemical treatment (such as SAM formation).

In the above embodiments, PEDOT solution is printed on the sample to form electrodes. However, it will be appreciated that other ink materials can be used in the above processes, including soluble organic and inorganic materials, water-based colloidal suspensions, and colloidal suspensions based on other organic and inorganic solutions. Such ink materials can include insulator, semiconductor, and conductor materials, so that any desired part of an electronic device can be formed by ink-jet printing.

In the above embodiments, a PMMA layer is deposited on a substrate using spin-coating. Similarly, in the TFT fabrication process described above the semiconductor and dielectric layers are deposited by spin-coating. However, alternative film deposition techniques can be used to deposit any or all of these layers, including doctor blading, printing (e.g. screen printing, offset printing, flexo printing, pad printing or ink-jet printing), dip-coating and spray-coating. In particular, ink-jet printing can be used to form all of the above layers.

The substrate in the above embodiments can be formed from both rigid materials such as glass, wood and stiff organic materials, and plastic materials such as polyethylene naphthalate (PEN) and polyethylene teraphthalate (PET).

The embossing tool can be made from any material suitable for impressing a pattern into the top layer of the sample, including semiconductors, metals, ceramics and polymers.

Electronic circuits comprising any number of TFTs, components having capacitor structures and/or other types of components can be manufactured by repeated application of methods according to one or more embodiments of the present invention to a work-piece. The capacitor structure fabrication and TFT fabrication methods of the present invention may both be performed on a single work-piece. The capacitor structure fabrication process of the present invention can be used to form single or multiple capacitors and light emitting diodes on a work-piece. The capacitor structure fabrication process of the present invention can also be used to manufacture a ferroelectric memory device by forming an array of capacitors as described above, wherein the functional material is a ferroelectric material used for the dielectric layer of each capacitor.

The foregoing description has been given by way of example only and it will be appreciated by a person skilled in the art that modifications can be made without departing from the scope of the present invention.

What is claimed is:

1. A method for fabricating an electronic device, the method comprising:
   embossing a surface of a work-piece using an embossing tool so as to form a microstructure including a stepped indentation in the work-piece surface, the indentation having first and second portions indented into the work-piece surface, the first portion being more indented than the second portion and overlapping the second portion when viewed from a direction normal to the work-piece surface so as to form a step between the first portion and the second portion; and
   depositing fluid containing a functional material onto the microstructure, the step of depositing fluid including:
      depositing a first layer of material in the first portion;
      depositing a second layer of material on the first layer of material and in the second portion; and
      depositing a third layer of material on the second layer of material and in the second portion, whereby a side edge of the second portion, a side edge of the third layer of material and a side edge of the second layer of material coincide when viewed from a direction normal to the work-piece surface,
   wherein the side edges define the extremities in the plane of the work-piece surface of the second portion, the third layer of material and the second layer of material respectively, and the side edges extend in a direction substantially normal to the work-piece surface.

2. A method according to claim 1, wherein the step of depositing fluid includes ink jet printing.

3. A method according to claim 1, wherein:
   the work-piece includes a substrate and an embossing layer formed on the substrate,
   the stepped indentation is formed in the embossing layer, and
   the step of depositing fluid includes:
      etching the work-piece surface after the step of embossing to remove the embossing layer at a bottom surface of the indentation, thereby exposing a portion of the substrate surface; and
      performing a first treatment on the work-piece surface to create a wetting contrast between the exposed portion of the substrate surface and the other portions of the work-piece surface.

4. A method according to claim 3, wherein:
   the first layer of material is deposited on the bottom surface after performing the first treatment; and
   the step of depositing fluid further includes:
      performing a second treatment on the work-piece surface to remove wetting contrast between a surface of the first layer of material and other portions of the work-piece surface; and
      performing a third treatment on the work-piece surface to create a wetting contrast between the portion of the work-piece surface in the indentation and other portions of the work-piece surface, before the step of depositing the second layer of material.

5. A method according to claim 4, wherein the first and second treatments include plasma treatment.

6. A method according to claim 4, wherein the third treatment includes soft-contact printing.

7. A method according to claim 1, wherein the first and third layers of material are electrodes.

8. A method for fabricating an electric device, the method comprising:
   forming a first concave portion and second concave portion by embossing a surface of a work-piece using an embossing tool, the second concave portion being within the first concave portion;
   depositing a first material into the first concave portion;
   depositing a second material on the first material, and in the second concave portion; and
   depositing a third material on the second material, and in the second concave portion,
   wherein when viewed from a direction normal to the work-piece surface, a first area of the first concave portion overlaps a second area of the second concave portion, and an edge of the second concave portion overlaps an edge of the second material and an edge of the third material.

* * * * *